United States Patent
Min et al.

[11] Patent Number: 5,865,888
[45] Date of Patent: Feb. 2, 1999

[54] SEMICONDUCTOR DEVICE EPITAXIAL LAYER LATERAL GROWTH RATE CONTROL METHOD USING $CBr_4$

[75] Inventors: Suk-Ki Min; Moo sung Kim; Seong-Il Kim, all of Seoul, Rep. of Korea

[73] Assignee: Korea Institute of Science and Technology, Seoul, Rep. of Korea

[21] Appl. No.: 684,721

[22] Filed: Jul. 22, 1996

[30] Foreign Application Priority Data

Oct. 27, 1995 [KR] Rep. of Korea .................. 1995 37594

[51] Int. Cl.[6] ....................................................... C30B 1/00
[52] U.S. Cl. .......................... 117/85; 117/104; 117/913; 117/923; 117/937; 117/940; 117/954; 117/92
[58] Field of Search .................................. 117/84, 85, 89, 117/104, 913, 923, 937, 940, 954, 92; 438/918, 418, 433

[56] References Cited

U.S. PATENT DOCUMENTS

| | | | |
|---|---|---|---|
| 5,061,643 | 10/1991 | Yagi | 437/19 |
| 5,168,077 | 12/1992 | Ashizawa | 437/107 |
| 5,498,568 | 3/1996 | Hosoba | 437/129 |
| 5,656,538 | 8/1997 | Gardner | 117/84 |

OTHER PUBLICATIONS

"MOCVD Growth of AlGaAs/GaAs Structures on Nonplanar Substrates: Evidence for Lateral Gas Phase Diffusion," by K.M. Dzurko, *Journal of Electronic Materials*, vol. 19, No. 12, 1990.

"Growth Behavior During Nonplanar Metalorganic Vapor Phase Epitaxy," by P.Demeester et al., *American Institute of Physics*, Apr. 1988.

"Atmospheric Pressure MOCVD Growth of GaAs and AlGaAs on Structured Substrates," by K.M. Dzurko et al., *Inst. Phys. Conf. Ser. No. 96; Chapter 3*.

"A Study of the Orientation Dependence of Ga(Al)As Growth by MOVPE," by S.D. Hersee et al., *Journal of Crystal Growth* 77 1986.

"The Fabrication of Quantum Wire Structures Through Application of $CCL_4$ Towards Lateral Growth Rate Control of GaAs on Patterned GaAs Substrates," by Yong Kim et al., *Appl. Phys. Lett.* 67 Sep. 25, 1995.

"Facet Evolution of $CCl_4$–doped $Al_{0.5}Ga_{0.5}As$/GaAs Multilayers During Metalorganic Chemical Vapor Deposition on Patterned GaAs Substrates," Yong Kim et al., *Journal of Crystal Growth* 156 1995.

*Primary Examiner*—R. Bruce Breneman
*Attorney, Agent, or Firm*—McDermott, Will & Emery

[57] ABSTRACT

A semiconductor device epitaxial layer lateral growth rate control method using $CBr_4$ gas involves regulating an epitaxial layer lateral growth rate in accordance with the $CBr_4$ amount doped into the epitaxial layer during the epitaxial layer growth occurring on a patterned GaAs substrate by means of a metalorganic chemical vapor deposition (MOCVD) process. The lateral growth rate may be regulated by varying the growth temperature and the V/III doping ratio.

5 Claims, 7 Drawing Sheets

SEMICONDUCTOR DEVICE EPITAXIAL LAYER LATERAL GROWTH RATE CONTROL METHOD USING CBR$_4$

BACKGROUND OF THE INVENTION

1. Field of the Invention

The present invention relates to a semicontuctor device epitaxial layer growth, and more particularly to a semiconductor device epitaxial layer lateral growth rate control method using CBr$_4$ gas capable of regulating a patterned semiconductor device lateral growth rate by doping CBr$_4$ gas into an epitaxial layer which is grown by a metalorganic chemical vapor deposition (MOCVD) on a patterned GaAs substrate.

2. Description of the Conventional Art

Recently, several studies on photoelectric device fabrication technology in relation with compound semiconductor device mechanisms are being conducted. However, to fabricate such a photoelectric device, a number of complicated fabrication steps are generally required.

A selective epitaxial growth technology which is one of the active studies being made in recent years, retains a strong advantage, in which a desired three-dimensional epitaxial layer structure can be obtained by a single layer growing process without any other complicated fabrication steps, and interface damage which may occur during display fabrication steps other than the selective epitaxial growth technology can also be prevented.

Further, a non-planar growth mechanism which is one of such selective epitaxial growth technologies applies to forming a mesa or V-groove type substrate and growing an epitaxial layer on the patterned substrate. The non-planar growth method favors the fabrication of a semiconductor device having a lateral structure, and a low threshold current laser diode manufacturing or an optical wave guide fabrication having low wave damage can be applicable thereto.

FIGS. 1A and 1B are cross-sectional views showing common semiconductor device structures which adopt the previously described non-planar growth method. Specifically, FIG. 1A is a cross-sectional view showing the vertical and lateral growth rates of a semiconductor device having a mesa pattern, and FIG. 1B is a cross-sectional view showing the vertical and lateral growth rates of a semiconductor device having a V-groove pattern.

As shown in FIGS. 1A and 1B, in order to form a desired device structure on a mesa or a V-groove type non-planar substrate 10, although a desired vertical growth rate R$_{ver}$ can be obtained by controlling the growth time or the source gas concentration, an appropriate technology for regulating a lateral growth rate R$_{lat}$ has yet to be realized.

A metalorganic chemical vapor deposition (hereinafter, "MOCVD") enables a partial regulation of the previously described growth rates by controlling the V/III group doping amount ratio of a fifth group reaction resource gas to a third group resource gas and a growth temperature; however, such a regulation tends to show a poor reproducibility, and moreover, because the rate of the lateral growth to the vertical growth does not exceed 2, a substantial lateral growth rate regulation remains difficult to achieve.

SUMMARY OF THE INVENTION

Accordingly, it is an object of the present invention to provide a semiconductor device epitaxial layer lateral growth rate control method capable of easily regulating a lateral growth rate by doping a small amount of CBr$_4$ gas into the epitaxial layer during an MOCVD applied epitaxial layer growth.

To achieve the above-described object, a semiconductor device epitaxial layer lateral growth rate control method involves regulating an epitaxial layer lateral growth rate in accordance with the CBr$_4$ gas amount being doped into the epitaxial layer when the epitaxial layer is grown by an MOCVD on a patterned GaAs substrate.

BRIEF DESCRIPTION OF THE DRAWINGS

FIGS. 2A and 2B are scanning electron microscope pictures showing a CBr$_4$ gas doping effect when a GaAs epitaxial layer is grown on a single mesa pattern; in which FIG. 2A is a scanning electron microscope picture taken cross-sectionally at a scale marker 6 μm before CBr$_4$ gas doping, and FIG. 2B is a scanning electron microscope picture taken cross-sectionally at a scale marker 5 μm after the doping of CBr$_4$ gas at a rate of 0.023 cc/min or $4.6 \times 10^{-6}$ mole/min.

DETAILED DESCRIPTION OF THE PREFERRED EMBODIMENTS

A semiconductor device epitaxial layer lateral growth rate control method using CBr$_4$ gas in accordance with the present invention is focused on regulating an epitaxial layer lateral growth rate by doping CBr$_4$ gas into an epitaxial layer during the epitaxial layer growth, and the lateral growth rate control steps are detailed as follows.

Figure 1A:
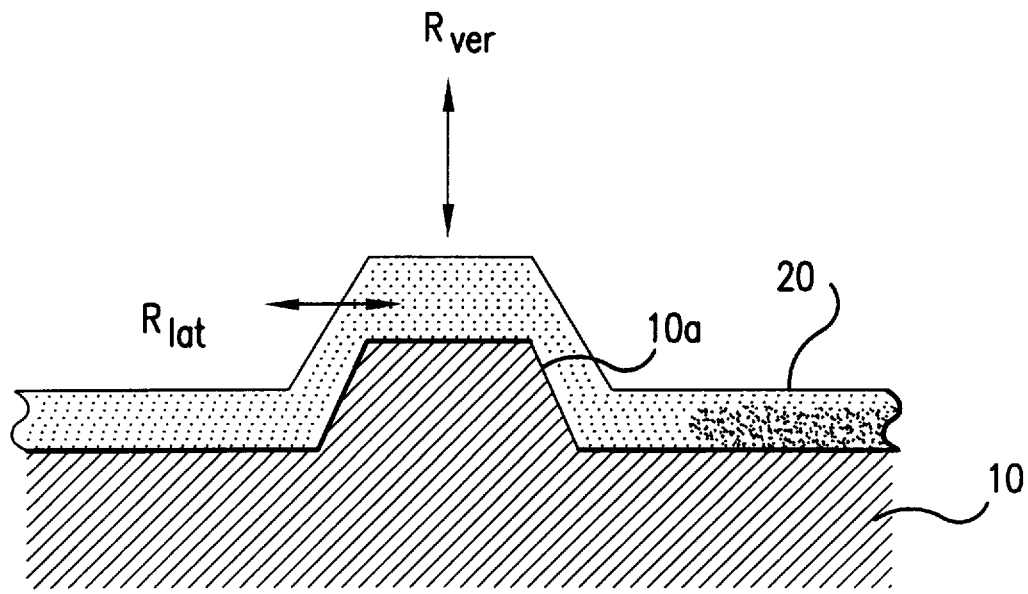
FIG. 1A is a cross-sectional view showing the vertical and lateral growth rates of a mesa patterned semiconductor device.
Figure 1B:
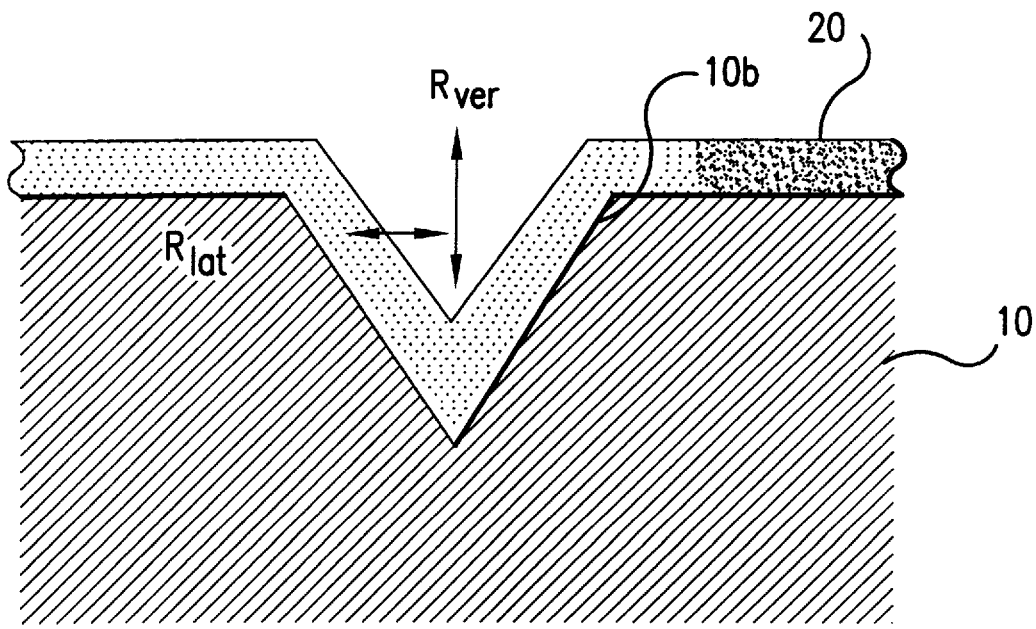
FIG. 1B is a cross-sectional view showing the vertical and lateral growth rates of a V-groove patterned semiconductor device.

First, as shown in FIGS. 1A and 1B, an epitaxial layer 20 is grown by means of an MOCVD on a (100) oriented GaAs substrate 10 having a single mesa 10$a$ which is formed thereon in parallel with a (011) orientation and a V-groove array lob which is formed in the surface thereof. Meanwhile, the single mesa 10$a$ and the V-groove array are formed by means of a photolithography process or a wet etching process.

To grow the epitaxial layer 20 applied by the MOCVD, high purity hydrogen is used at a flow rate of 5 l/min so as to act as a carrier gas. During the epitaxial layer growth, trimethylgallium (hereinafter, "TMG") or trimethylaluminium (hereinafter, "TMA") is adopted as a third group metal organic resource, and $AsH_3$ gas (Arsine) which is diluted in hydrogen at the ratio of 9 hydrogen to 1 $ASH_3$ is employed as a fifth group resource. At this time, the $CBr_4$ gas concentration varies from zero (before $CBr_4$ gas doping) to $4.6 \times 10^{-6}$ mole/min or 0.023 cc/min, and the epitaxial layer growth temperature is confined from 600° C. to 800° C. The V/III value changes from 5 to 120 which is the ratio of the fifth group resource doping amount to the third group resource doping amount.

To perform a minute observation of the GaAs epitaxial layer growth aspect, the present invention has been applied to grow a five-sublayer GaAs epitaxial layer, in which each sublayer includes a marker composed of a 400 Å-thickness $Al_{0.5}Ga_{0.5}As$ epitaxial layer. The thusly grown specimen has been observed by a scanning electron microscope.

Figure 2A:
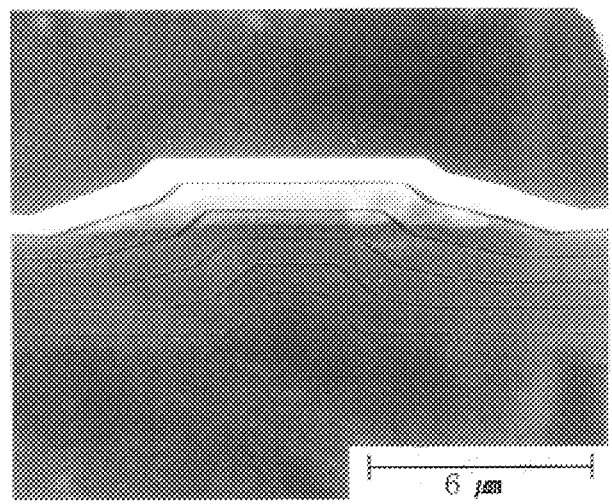

Referring to FIG. 2A, the picture taken before $CBr_4$ gas doping exhibits a mesa pattern lateral growth rate which is almost similar to the vertical growth rate thereof.

Figure 2B:
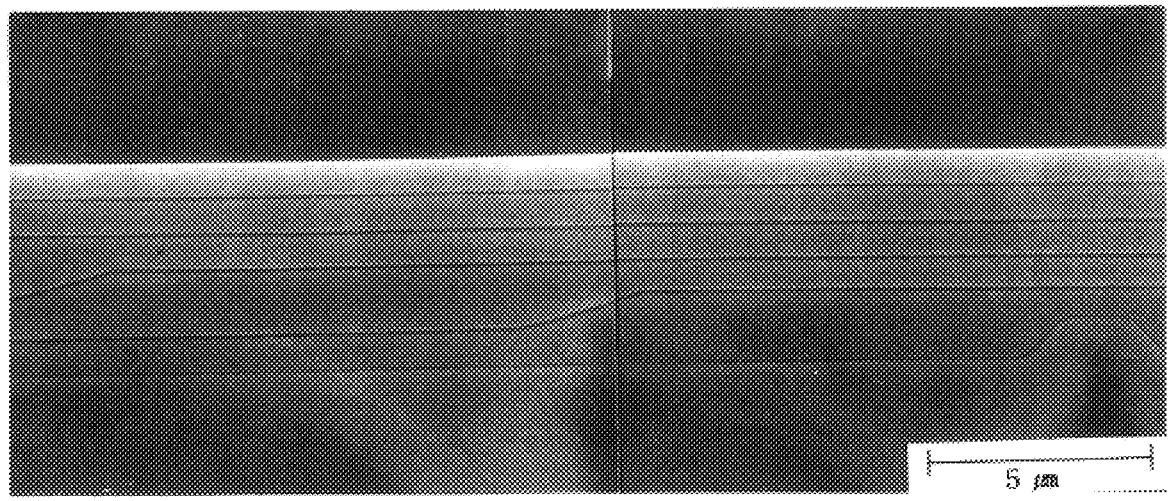

Meanwhile, as shown in FIG. 2B, the $CBr_4$ gas doped into the epitaxial layer during the layer growth enables a significant lateral growth rate increase; the $CBr_4$ gas doping occurred at 0.0023 cc/min or $4.6 \times 10^{-6}$ mole/min. At this time, the epitaxial layer growth temperature $T_g$ was at 750° C.

Figure 3:
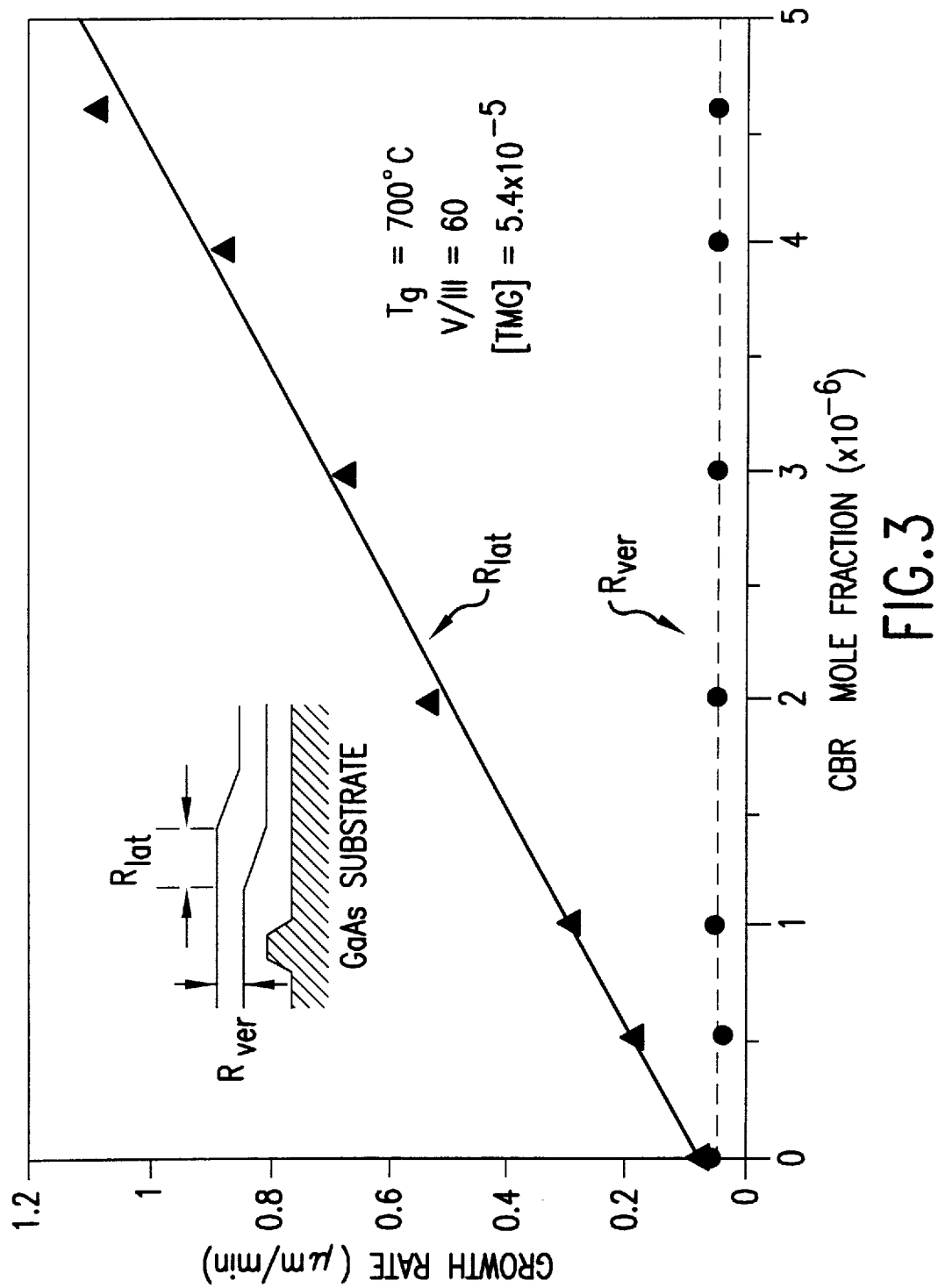
FIG. 3 is a graph showing variations of the vertical R$_{ver}$ and lateral R$_{lat}$ growth rates occurring in a GaAs epitaxial layer in accordance with CBr$_4$ gas concentration.

FIG. 3 is a graph showing the variations in each of the GaAs epitaxial layer vertical growth rate $R_{ver}$ and lateral growth rate $R_{lat}$ in accordance with $CBr_4$ flux concentration at the temperature of 700° C. The V/III ratio in FIG. 3 denotes a mole fraction ratio of $AsH_3$ gas to TMG. $[CBr_4]$ and [TMG] describe the concentrations of $CBr_4$ and TMG respectively. The FIG. 3 also shows $CBr_4$ concentration having little influence on the vertical growth rate; however, the lateral growth rate exhibits a geometric increase in accordance with the $CBr_4$ concentration.

Figure 4:
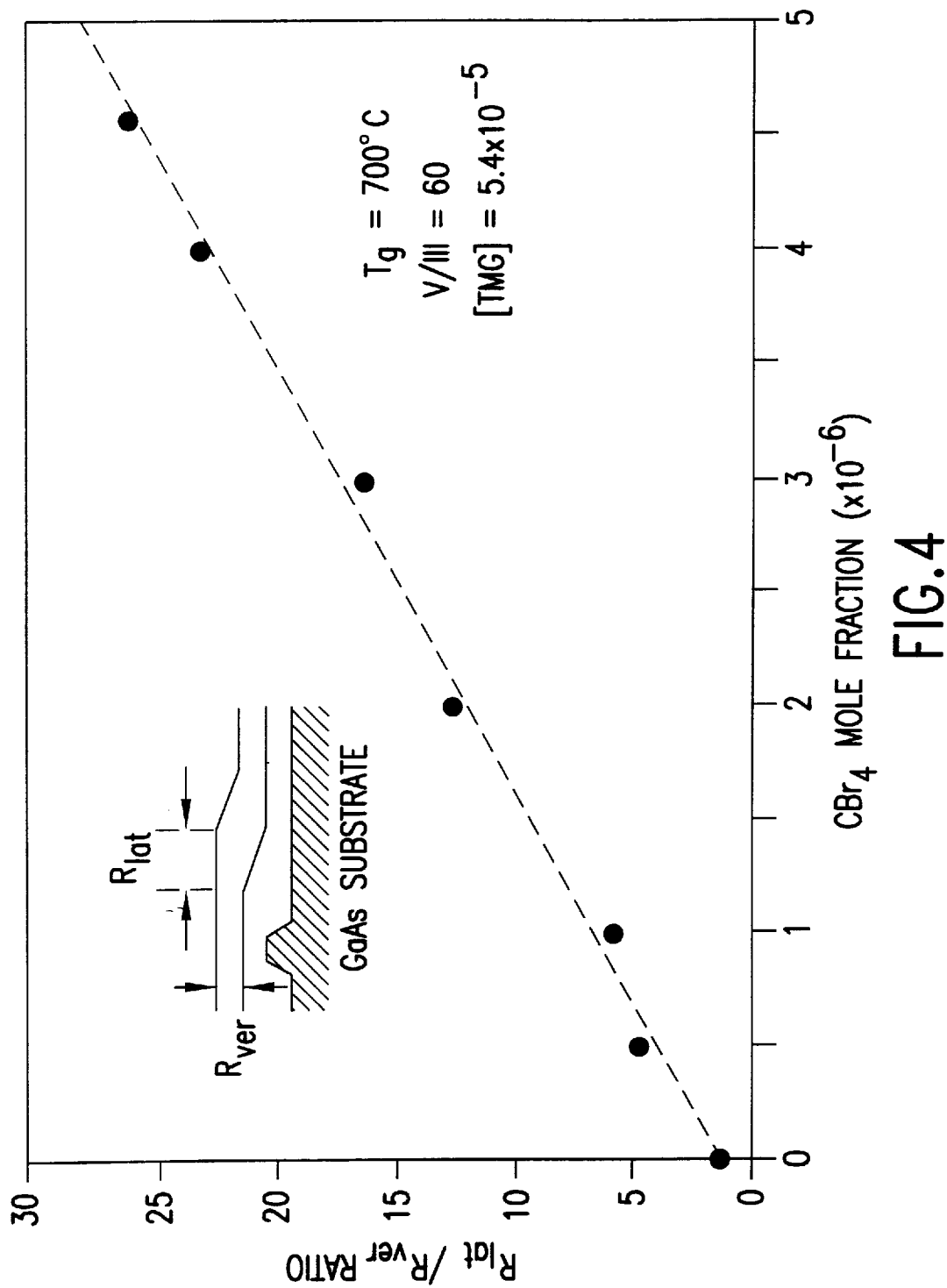
FIG. 4 is a graph showing variations in the growth ratio R$_{lat}$/R$_{ver}$ of the lateral growth rate R$_{lat}$ to the vertical growth rate R$_{ver}$ in a GaAs epitaxial layer in accordance with the CBr$_4$ gas concentration.

As shown in FIG. 4, when the epitaxial layer growth temperature is at 700° C., and the $CBr_4$ concentration is at $4.6 \times 10^{-6}$ mole/min, the ratio $R_{lat}/R_{ver}$ of the lateral growth rate to vertical growth rate can reach up to 26.

As a result, in accordance with the results shown in FIGS. 3 and 4, the selective regulation of the lateral growth rate can be achieved depending on the $CBr_4$ concentration without a noticeable variation in the vertical growth rate.

Figure 5:
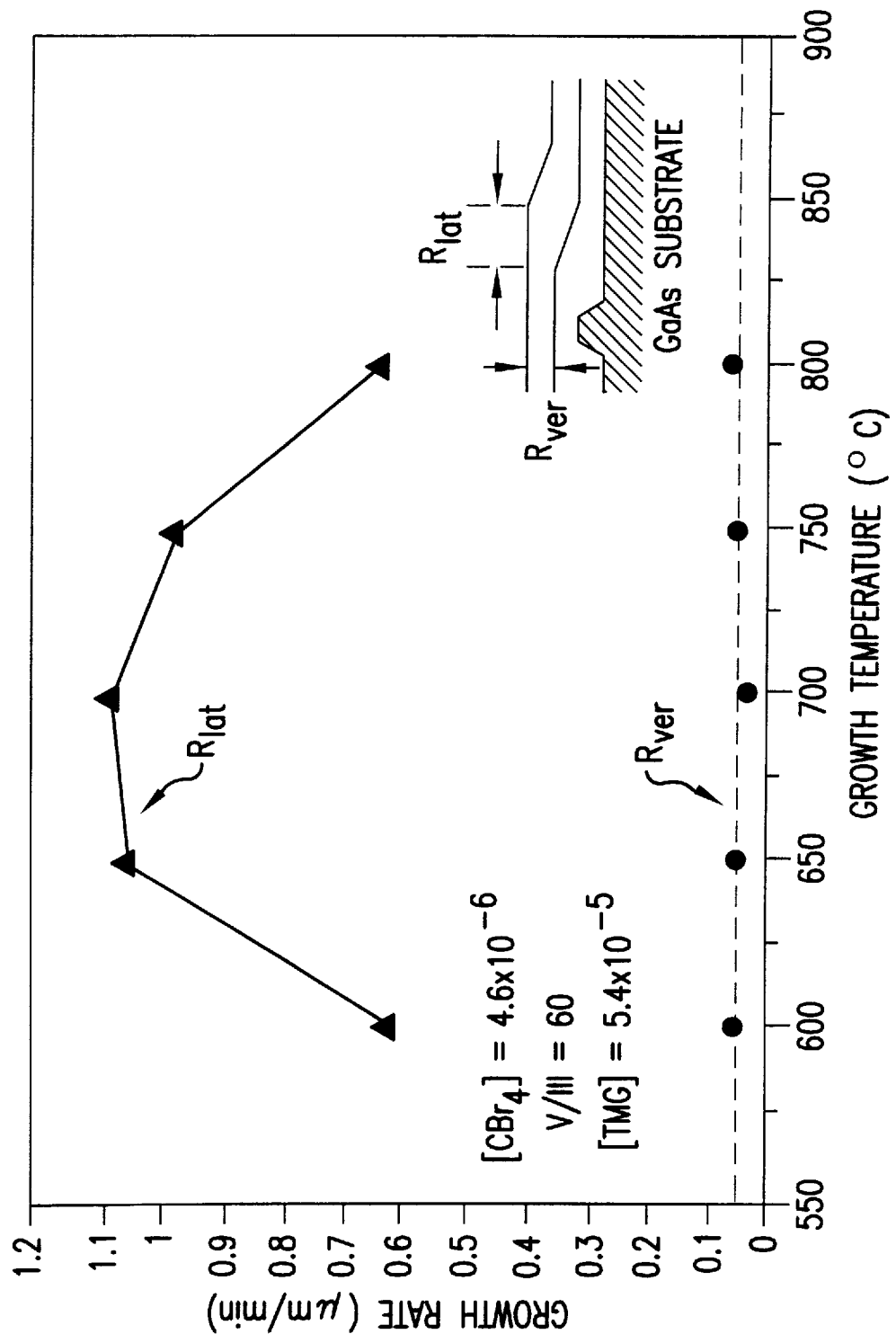
FIG. 5 is a graph showing variations in the growth rates between the mesa pattern lateral growth rate R$_{lat}$ and the mesa vertical growth rate R$_{ver}$ in accordance with growth temperatures.

FIG. 5 is a graph showing the respective dependence of the epitaxial layer lateral growth rate and the vertical growth rate on the temperature, in which a vertical growth rate is little changed during temperature variations, yet the lateral growth shows its highest rate at 700° C., and the growth rate decreases at temperatures higher than 700° C.; $CBr_4$ gas doping enables lateral growth rate regulation by means of growth temperature variation. The V/III ratio in FIG. 5 denotes the mole fraction ratio of AsH3 gas to TMG, and $[CBr_4]$ and [TMG] describe the concentrations of $CBr_4$ and TMG respectively.

Figure 6:
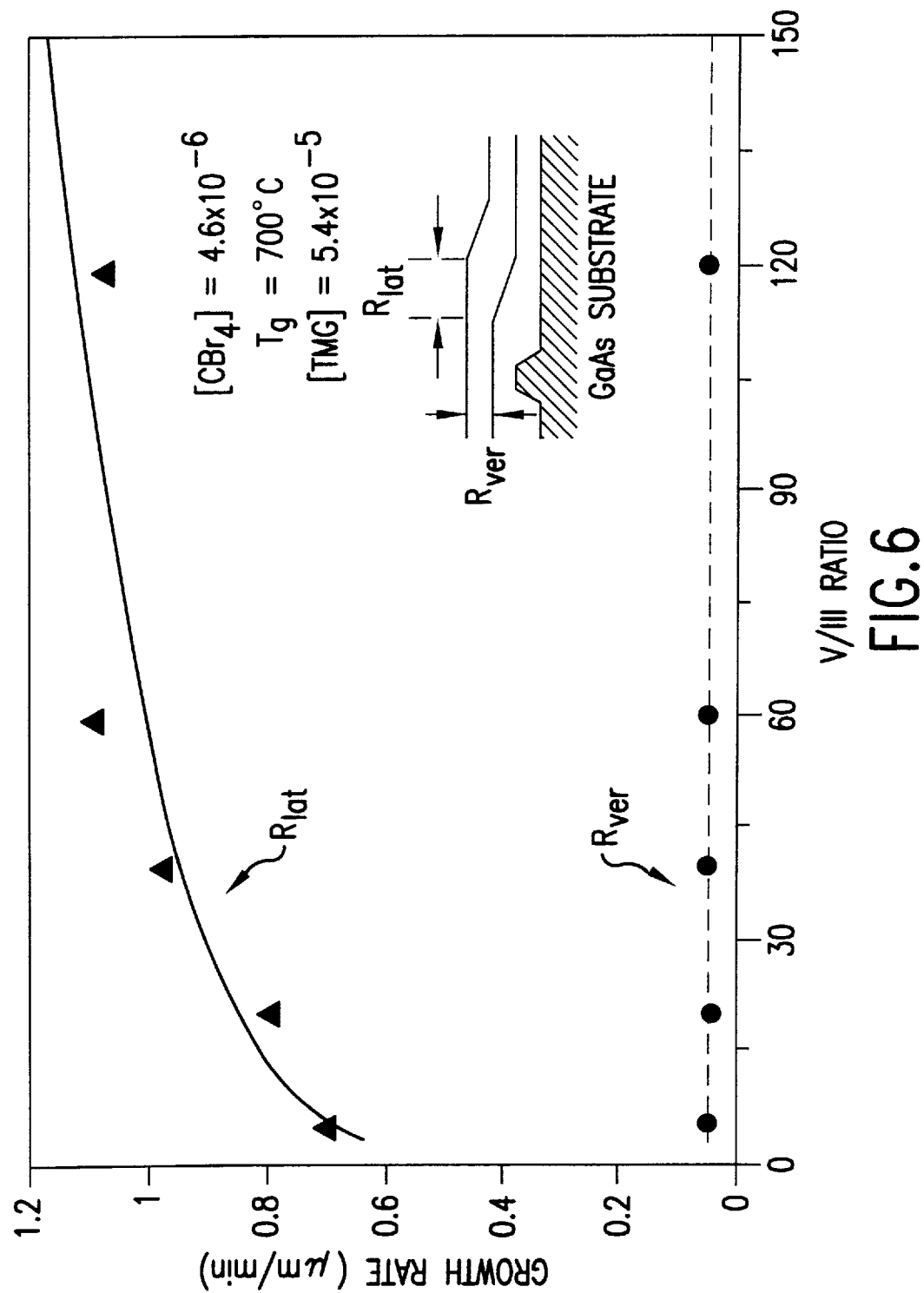
FIG. 6 is a diagram showing variations in the growth rates between the lateral growth rate R$_{lat}$ and the vertical growth rate R$_{ver}$ in accordance with the V/III concentration ratio V/III of AsH$_3$ gas to TMG (trimethylgallium).

FIG. 6 is a graph showing the variations in the lateral growth rate and the vertical growth rate, which occur in the GaAs epitaxial layer. The vertical growth rate in FIG. 6 hardly changes despite the increase in the V/III ratio; however, the lateral growth increases rapidly until the V/III ratio reaches 40, then slows due to saturation.

Figure 7A:
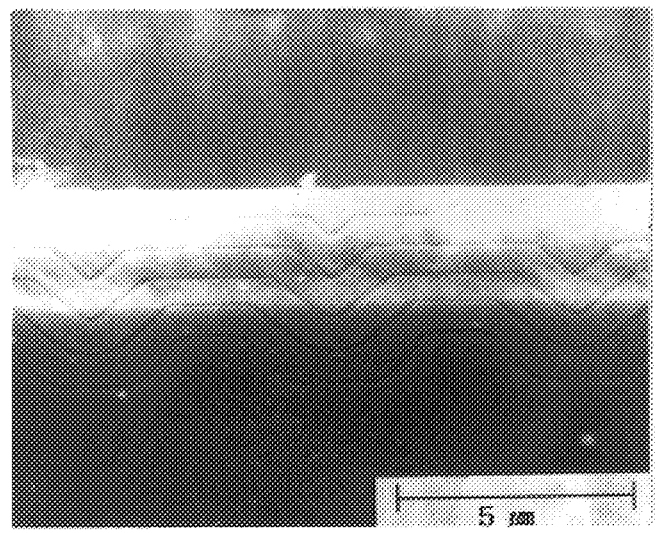
FIGS. 7A and 7B are scanning electron microscope pictures showing a CBr$_4$ doping effect occurring when a GaAs epitaxial layer is grown on a V-groove substrate; in which the FIG. 7A is a scanning electron microscope picture taken cross-sectionally at a scale marker 5 μm before CBr$_4$ doping, and the FIG. 7B is a scanning electron microscope picture taken cross-sectionally at a scale marker 5 μm after the doping of CBr$_4$ at a rate of 0.023 cc/min or $4.6 \times 10^{-6}$ mole/min.
Figure 7B:
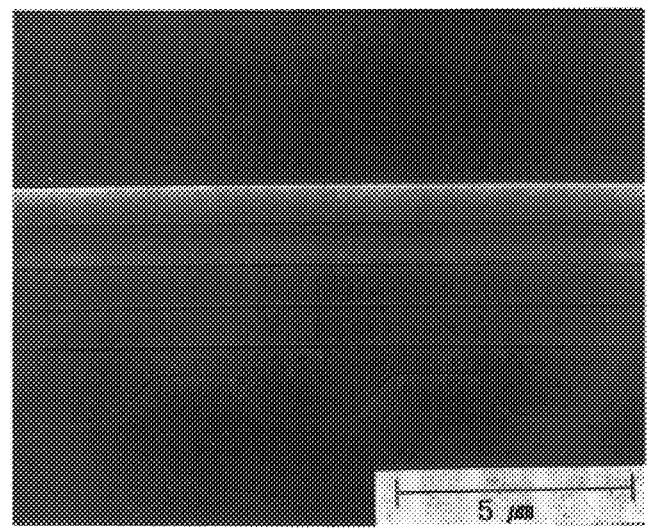

FIGS. 7A and 7B are scanning electron microscope pictures showing $CBr_4$ doping effect occurring when a GaAs epitaxial layer is grown on a V-grooved substrate. The black marker lines in FIGS. 7A and 7B are AlGaAs layers which are for effectively observing the epitaxial layer growth.

FIG. 7A is a scanning electron microscope picture taken cross-sectionally before $CBr_4$ doping; FIG. 7A shows a conventional common property, in which the lateral growth rate as well as the vertical growth rate exhibits little growth rate variations.

FIG. 7B is a scanning electron microscope picture taken cross-sectionally after the doping of $CBr_4$ at a rate of 0.023 cc/min or $4.6 \times 10^{-6}$ 6 mole/min, in which the epitaxial layer lateral growth rate has increased so much that the planarization of the epitaxial layers have been already obtained at the first epitaxial layer formed on the substrate; the planarization of a semiconductor device can be regulated by the $CBr_4$ gas doping method.

As detailed above, the semiconductor device epitaxial layer lateral growth rate control method using $CBr_4$ gas in accordance with the present invention enables regulating the epitaxial layer lateral growth rate by $CBr_4$ gas doping when an epitaxial layer is grown on a mesa or V-groove patterned GaAs substrate employing MOCVD, thus planarizing the semiconductor device.

What is claimed is:

1. A semiconductor epitaxial layer lateral growth rate control method, comprising regulating the lateral growth rate in accordance with the amount of $CBr_4$ gas doped into the epitaxial layer during its growth on a patterned GaAs substrate employing an MOCVD process.

2. The method of claim 1, wherein, during the epitaxial layer growth using said $CBr_4$ doping, the epitaxial layer lateral growth rate is regulated by changing the epitaxial layer growth temperature or the ratio of group V atoms to group III atoms which are respectively contained in source gases of said epitaxial layer.

3. The method of claim 1, wherein said patterned GaAs substrate is formed into a mesa type or a V-grooved type by photolithography or wet etching.

4. The method of claim 2, wherein said epitaxial layer growth temperature varies from 600° C. to 800° C.

5. The method of claim 2, wherein the ratio of the group V atoms to the group III atoms which are respectively contained in said source gases of said epitaxial layer varies from 5 to 120.

* * * * *